United States Patent
Schindler et al.

(10) Patent No.: US 9,831,856 B2
(45) Date of Patent: Nov. 28, 2017

(54) ELECTRONIC DRIVE CIRCUIT AND METHOD

(71) Applicant: Infineon Technologies AG, Neubiberg (DE)

(72) Inventors: Alexis Schindler, Reutlingen (DE); Bernhard Wicht, Reutlingen (DE); Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/060,234

(22) Filed: Mar. 3, 2016

(65) Prior Publication Data

US 2016/0294384 A1    Oct. 6, 2016

(30) Foreign Application Priority Data

Mar. 31, 2015    (DE) .................. 10 2015 104 946

(51) Int. Cl.
| | |
|---|---|
| *H03K 3/00* | (2006.01) |
| *H03K 5/08* | (2006.01) |
| *H03K 17/0412* | (2006.01) |
| *H03K 17/16* | (2006.01) |

(52) U.S. Cl.
CPC .......... *H03K 5/08* (2013.01); *H03K 17/04123* (2013.01); *H03K 17/162* (2013.01)

(58) Field of Classification Search
CPC ... H03K 5/08; H03K 17/04123; H03K 17/162
USPC ....................................................... 327/109
See application file for complete search history.

(56) References Cited

U.S. PATENT DOCUMENTS

| | | | | |
|---|---|---|---|---|
| 7,126,389 B1* | 10/2006 | McRae | ............... | H03K 17/167 326/85 |
| 7,791,406 B1* | 9/2010 | Wang | ............... | H03K 19/0016 326/34 |
| 8,558,586 B1* | 10/2013 | Martin | ............... | G11C 7/1057 327/108 |
| 8,564,359 B2* | 10/2013 | Brauer | ............... | H03K 17/166 327/427 |
| 8,890,603 B2* | 11/2014 | Mitsuda | ............... | H03K 17/687 327/108 |
| 2004/0056700 A1* | 3/2004 | Amick | ............... | H03K 19/0013 327/333 |
| 2006/0033551 A1* | 2/2006 | Dong | ............... | H03K 17/166 327/427 |
| 2008/0129256 A1* | 6/2008 | La Placa | ............... | G11C 16/30 323/234 |
| 2012/0146716 A1* | 6/2012 | Shi | ............... | H03K 17/163 327/540 |
| 2013/0321035 A1* | 12/2013 | Bodano | ............... | H03K 17/165 327/109 |

* cited by examiner

*Primary Examiner* — Ryan Jager
(74) *Attorney, Agent, or Firm* — Shumaker & Sieffert, P.A.

(57) ABSTRACT

Disclosed is an electronic drive circuit and a drive method. The drive circuit includes an output; a first output transistor comprising a control node and a load path, wherein the load path is coupled between the output and a first supply node; a voltage regulator configured to control a voltage across the load path of the first output transistor; and a first driver configured to drive the first output transistor based on a first control signal.

14 Claims, 10 Drawing Sheets

US 9,831,856 B2

ELECTRONIC DRIVE CIRCUIT AND METHOD

Embodiments of the present invention relate to an electronic circuit, in particular an electronic drive circuit for driving a capacitive load such as, for example, the gate of an transistor.

MOS transistors such as MOSFETs (Metal Oxide Semiconductor Field-Effect Transistors) or IGBTs (Insulated Gate Bipolar Transistors) are widely used in automotive, industrial, or consumer electronic applications for driving loads, converting power, or the like. MOS transistors are voltage controlled devices that include an internal capacitance (often referred to as gate-source capacitance) formed by a gate electrode, a gate dielectric and body and source regions. The MOS transistor can be switched on and off by charging and discharging the internal capacitance, wherein switching on includes one of charging and discharging the internal capacitance, and switching off includes the other one of charging and discharging the internal capacitance. For example, in an enhancement type MOS transistor, switching on the MOS transistor includes charging the internal capacitance and switching off the MOS transistor includes discharging the internal capacitance. It is desirable to switch those MOS transistors at high frequency, that is, to charge and discharge the internal capacitance at a high rate.

There is therefore a need for an electronic drive circuit that is capable of driving a capacitive load at a high frequency.

One embodiment relates to an electronic circuit. The electronic circuit includes an input configured to receive an input signal and an output configured to be coupled to load, an output transistor having a load path and a control node, wherein the load path is connected between the output and a first supply node, and a drive transistor having a load path and a control node, wherein the load path is connected to the control node of the output transistor. A first electronic switch is connected in series with the load path of the drive transistor. A biasing circuit having an internal impedance is connected between the control node of the drive transistor and the first supply node. The electronic circuit further includes a control circuit configured to receive the input signal and to drive the first electronic switch based on the input signal.

Another embodiment relates to a method. The method includes driving a first output transistor coupled to an output of a drive circuit by a first driver based on a first control signal, and controlling a voltage across the load path of the first output transistor by a voltage regulator.

Examples are explained below with reference to the drawings. The drawings serve to illustrate certain principles, so that only aspects necessary for understanding these principles are illustrated. The drawings are not to scale. In the drawings the same reference characters denote like features.

FIG. 1 shows an electronic drive circuit including an output transistor and a voltage regulator according to one embodiment;

FIG. 2 which includes FIGS. 2A-2B, shows timing diagrams of an output current of the drive circuit shown in FIG. 1 and of a conventional drive circuit;

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
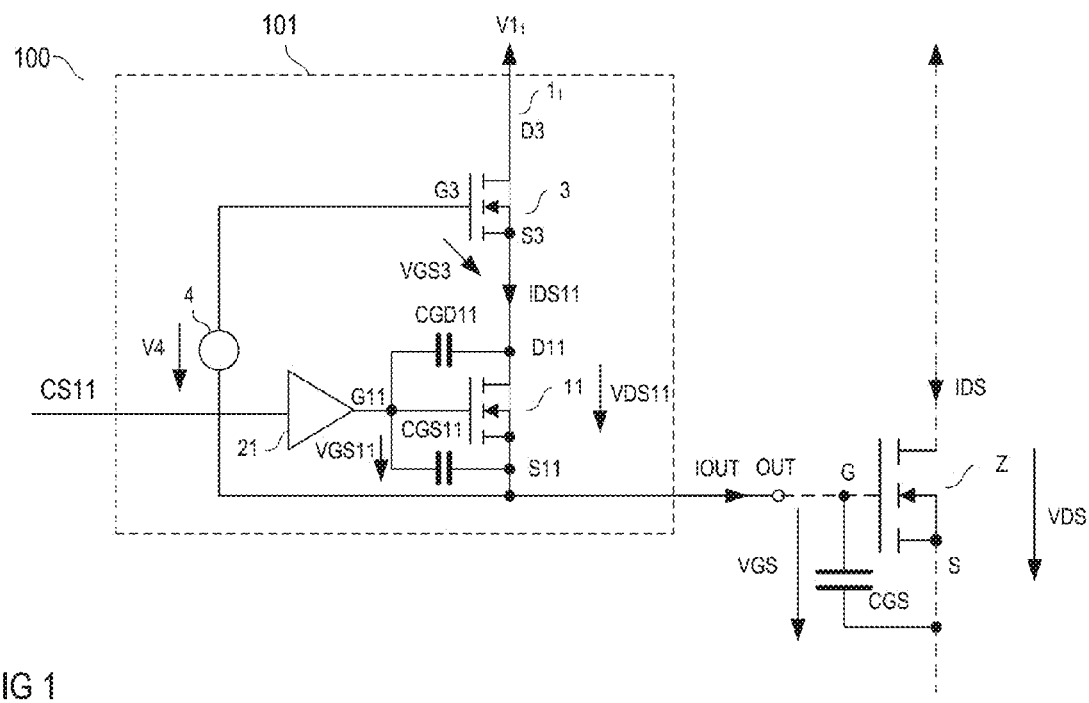

FIG. 1 shows an electronic drive circuit 100 according to one embodiment. This electronic drive circuit 100 is configured to drive a load by driving an output current IOUT into the load. In particular, the electronic drive circuit 100 is configured to drive a capacitive load. For example, the capacitive load is an MOS transistor. An MOS transistor, such as a MOSFET or an IGBT, is a voltage controlled semiconductor device that switches on or off dependent on a charging state of an internal gate-source capacitance. Just for the purpose of illustration FIG. 1 shows a capacitive load Z implemented as a MOSFET, in particular, an n-type enhancement MOSFET. However, this is only an example. Any other type of MOS-transistor may be driven by the electronic drive circuit as well. The internal gate-source capacitance of this MOSFET is represented by a capacitor CGS connected between a gate node G and a source node S of the MOSFET Z.

Referring to FIG. 1, the electronic drive circuit 100 includes an output OUT configured to be coupled to the load Z and to provide the output current. In case the load Z is a MOSFET (as shown in FIG. 1) the output OUT of the electronic drive circuit 10 is connected to the gate node G of the MOSFET Z.

The electronic drive circuit 100 further includes an output transistor 11, a voltage regulator 3, 4, and a driver 21. The output transistor 11 includes a control node G11 and a load path coupled between the output OUT and a first supply node $1_1$. The voltage regulator 3, 4 is configured to control a voltage VDS11 across the load path of the output transistor 11, and the driver 21 is configured to drive the output transistor 11 based on a first control signal CS11. In the embodiment shown in FIG. 1, the voltage regulator 3, 4 includes a regulator transistor 3 having a control node G3 and a load path. The load path is connected in series with the load path of the output transistor 11, whereas a series circuit with the load path of regulator transistor 3 and the load path of the output transistor 11 is connected between the output OUT and a first supply node $1_1$. The voltage regulator 3, 4 further includes a biasing voltage source 4 coupled between the control node G3 of the regulator transistor 3 and a first load path node S11 of the output transistor. In the embodiment shown in FIG. 1, the first load path node S11 of the output transistor 11 is connected to the output 11.

The circuit elements explained above, that is, the output transistor 11, the voltage regulator 3, 4 and the driver 21 are part of a first drive circuit 101, which will briefly be referred to as first driver or high-side driver in the following. This first driver 101 is configured to charge a capacitive load coupled to the output OUT. If, as shown in FIG. 1, the load Z is an MOS transistor that has its gate node G coupled to the output OUT the capacitive load is the internal gate-source capacitance CGS of the MOS transistor. Charging this internal gate-source capacitance CGS by the first driver 101 is equivalent to switching on the MOS transistor Z. Besides the first driver 101 configured to charge a capacitive load (switch on an MOS transistor) the electronic circuit 10 may include a second driver (not shown in FIG. 1) configured to discharge the capacitive load (switch off the MOS transistor). Such second driver is explained herein further below. When the electronic circuit 100 charges the capacitive load the output current IOUT flows in a direction shown in FIG. 1, and when the electronic circuit 100 discharges the capacitive load the output current IOUT flows in a direction opposite the direction shown in FIG. 1.

The first driver 101 charges the capacitive load CGS (switches on the MOS transistor Z) when the output transistor 11 is in an on-state (is switched on). The operation state (on or off) of the output transistor 11 is governed by the driver 21 based on the first control signal CS11. The first control signal CS11 may have two different signal levels, namely an on-level and an off-level, whereas the driver 21 may be configured to switch on the output transistor 11 when the control signal CS11 has the on-level and to switch off the output transistor 11 when the control signal CS11 has the off-level.

One way of operation of the first driver 101 shown in FIG. 1 is explained in the following. For the purpose of explanation it is assumed that each of the output transistor 11 and the regulator transistor 3 is an n-type MOSFET, in particular, an n-type enhancement MOSFET. In this case, the control node of the output transistor 11 is the gate node of the MOSFET forming the output transistor, and the control node of the regulator transistor 3 is the gate node of the MOSFET forming the regulator transistor 3. Furthermore, the load path of the output transistor 11 and the regulator transistor 3, respectively, is the drain-source path of the MOSFET forming the respective transistor 11, 3. Referring to FIG. 1, the source node S11 of the MOSFET forming the output transistor 11 (briefly referred to as the source node of the output transistor 11 in the following) is connected to the output OUT, and the drain node D11 is connected to source node S3 of the MOSFET forming the regulator transistor 3 (briefly referred to as the source node S3 of the regulator transistor 3 in the following). The drain node D3 of the regulator transistor 3 is connected to the first supply node $1_1$, and the gate node G3 of the regulator transistor 3 is connected to the biasing source 4

The output transistor 11 includes parasitic capacitances. Two of these parasitic capacitances are shown in FIG. 1, namely a gate-source capacitance CGS11 between the gate node G11 and the source node S11, and a gate-drain capacitance CGD11 between the gate node G11 and the drain node D11. The output transistor 11 further includes a drain-source capacitance between the drain node D11 and the source node S11. This drain-source capacitance, however, is not explicitly shown in FIG. 1. Likewise, parasitic capacitances of the regulator transistor 3 are not shown in FIG. 1. The charging state of the gate-source capacitance CGS11 of the output transistor 11, or a gate-source voltage VGS11 across the gate-source capacitance CGS11, respectively, defines the operation state of the output transistor 11. The operation state of the output transistor may include an on-state, in which the output transistor is switched on, and an off-state, in which the output transistor is switched off. The output transistor 11 is in the on-state when the gate-source capacitance CGS11, by the driver 21, has been charged such that the gate-source voltage VGS11 has reached a threshold voltage of the output transistor 11. The output transistor 11 is in the off-state when the gate-source capacitance CGS11, by the driver 21, has been discharged such that the gate-source voltage VGS11 is below the threshold voltage of the output transistor 11. The regulator transistor 3 is in the off-state when the gate-source voltage VGS3, which is the voltage between the gate node G3 and the source node S3, is below the threshold voltage of the regulator transistor 3, and the regulator transistor 3 is in the on-state when the gate-source voltage VGS3 is above the threshold voltage of the regulator transistor 3. For example, the threshold voltage of each of the output transistor 11 and the regulator transistor 3 is several volts. According to another embodiment, which explained herein further below, the output transistor 11, in the on-state, includes several operation states at different gate-source voltages VGS11.

When the output transistor 11 is in the off-state, a voltage level of the drain-source voltage VDS11, which is the voltage between the drain node D11 and the source node S11, substantially corresponds to a voltage level of the biasing voltage V4 provided by the biasing voltage source 4. In the on-state of the output transistor 11, the regulator transistor 3 drives a current IDS11 through the output transistor 11 such that the drain-source voltage VDS11 of the output transistor 11 is substantially constant. A level of this voltage VDS11 is given by the level of the biasing voltage V4 minus the level of the gate-source voltage VGS3 of the regulator transistor 3. As (like in every MOSFET) the current level of the current IDS11 through the regulator transistor 3 is exponentially dependent on the level of the gate-source voltage VGS3, in the on-state of the regulator transistor 3, there are only slight variations of the gate-source voltage VGS3, although there may be heavy variations of the current IDS11. Thus, in the on-state of the regulator transistor 3, the drain-source voltage VDS11 of the output transistor 11 can be considered to be substantially constant.

Regulating the level of the output transistor's 11 drain-source voltage VDS11 by the regulator transistor 3 has the effect that, there is no significant drop in the drain-source current IDS11 (the output current IOUT) due to the so-called Miller-effect. This is different from conventional drive circuits that do not include a regulator transistor, and is explained in the following.

Before the output transistor 11 switches on, the gate-source voltage VGS11 is substantially zero and the level of the drain-source voltage VDS11 substantially corresponds to the level of the biasing voltage V4. Thus, a level of a voltage between the drain node D11 and the gate node G11, and across the gate-drain capacitance CGD11, substantially corresponds to the level of the biasing voltage V4. When, based on the control signal CS11, the driver 21 charges the gate-source capacitance CGS11, the output transistor 11 switches on when the level of the gate-source voltage VGS11 across the gate-source capacitance CGS11 reaches the threshold voltage.

Figure 2A:
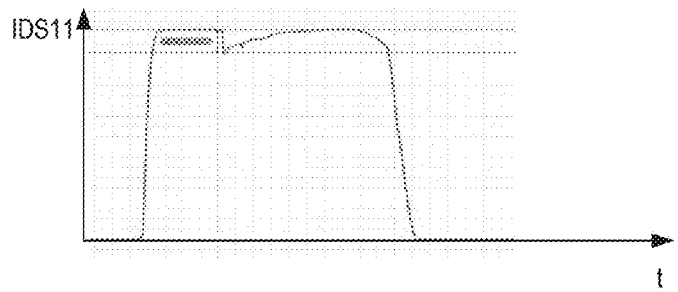
Figure 2B:
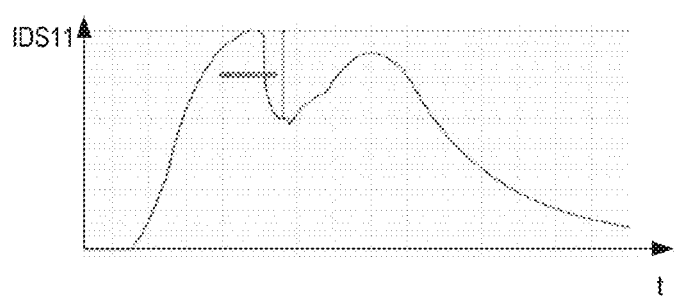

Assume that the regulator transistor 3 is omitted. In this case, switching on the output transistor 11 results in a decrease of the drain-source voltage VDS11. By virtue of the gate node G11 being capacitively coupled with the drain node D11 via the gate-drain capacitance CGD11, a decrease of the drain-source voltage VDS11 results in a decrease of the electrical potential at the gate node G11 until the gate-drain capacitance CGD11 has been discharged. This is known as Miller-effect and results in a drop of the current IDS11 through the output transistor 11. FIG. 2B shows a timing diagram of the current IDS11 through the output transistor 11 in a drive circuit of the type shown in FIG. 1, when the regulator transistor 3 is omitted.

The regulator transistor 3 prevents the drain-source voltage VDS11 of the output transistor 11 from decreasing (dropping) significantly when the output transistor 11 switches on. Thus, the Miller-effect is widely avoided so that there is no significant decrease of the drain-source current IDS11 (the output current IOUT) through the output transistor 11 after the output transistor 11 switches on. FIG. 2A shows a timing diagram of the current IDS11 through the output transistor 11 in the first driver 101 shown in FIG. 1.

Figure 3:
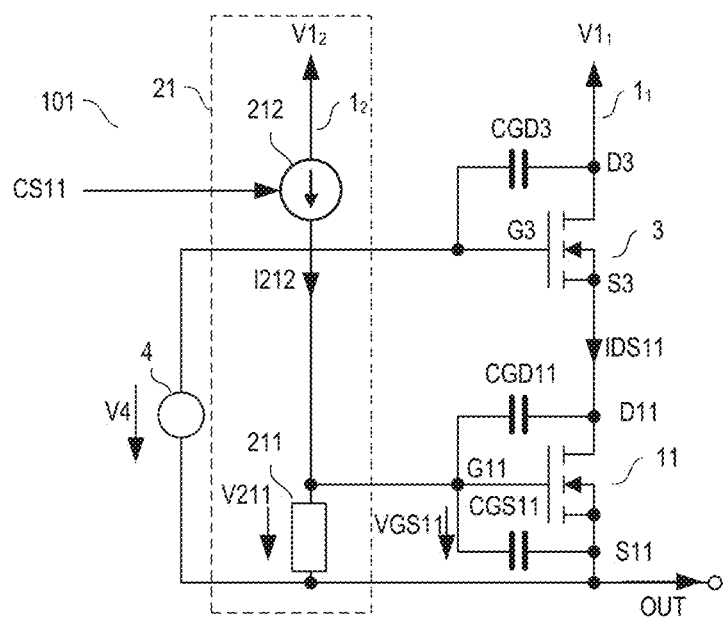
FIG. 3 shows one embodiment of a driver of the output transistor.

FIG. 3 shows one embodiment of the driver 21 driving the output transistor 11. In this embodiment, the driver 21 includes a resistor 211 connected in series with a current source 212. The resistor 211 is connected between the gate node G11 and the source node S11 of the output transistor 11. The current source 212 is a controlled current source that is controlled by the first control signal CS11. The current source 212 is connected between the resistor 211 and a second supply node $1_2$ where a second supply potential $V1_2$ is available. This second supply potential $V1_2$ may be equal to the first supply potential $V1_1$ at the first supply node $1_1$, or may be different from the first supply potential $V1_1$. According to one embodiment, an on-level of the control signal CS11 switches on the current source 212 and an off-level of the control signal CS11 switches off the current source 212. According to one embodiment, an output current I212 of the current source 212 is zero when the current source 212 has been switched off and a current level of the output current I212 is different from zero when the current source 212 has been switched on. The current level of the output current I212, in the on-state of the current source 212, and a resistance of the resistor 211 define an operation point of the output transistor 11 in the on-state. That is, the level of the gate-source voltage VGS11 of the output transistor 11 in the steady state of the output transistor 11 is substantially given by $$VGS11_{ON}=R211 \cdot I212_{ON} \quad (1),$$

wherein $VGS11_{ON}$ is the level of the gate-source VGS11 in the on-state of the output transistor, R211 is the resistance of the resistor 211, and $I212_{ON}$ is the current level of the current I212 in the on-state (activated state) of the current source 212.

Figure 4A:
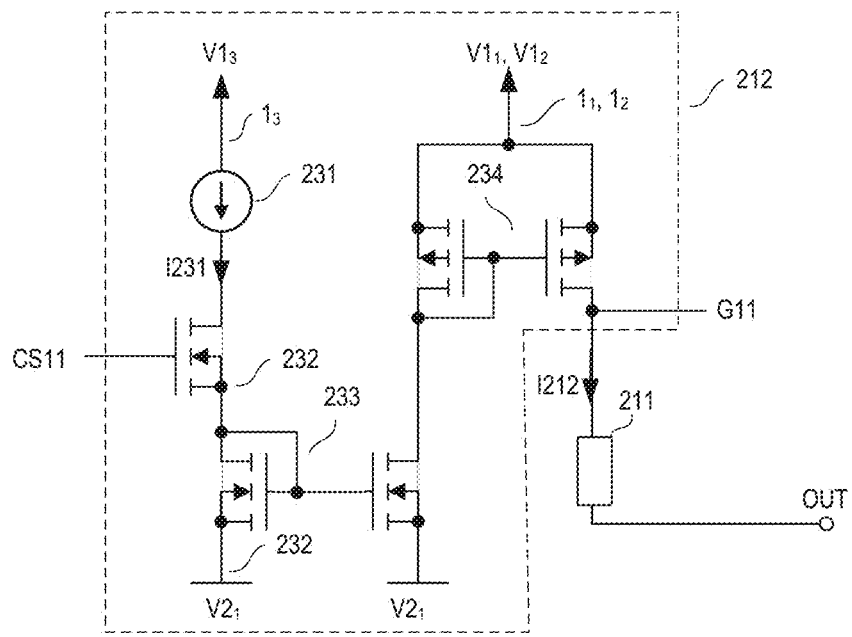
FIGS. 4A-4B show different embodiments of a current source in the driver shown in FIG. 3.

FIG. 4A shows one embodiment of the controllable current source 212. This current source 212 includes a series circuit with a current source 231, an electronic switch 232, and an input transistor of a first current mirror 233, with this series circuit being connected between a third supply node $1_3$ where a third supply potential $V1_3$ is available, and a fourth supply node $2_1$ where a fourth supply potential $V2_1$ is available. The fourth supply node $2_1$ may be a ground node, and the fourth supply potential $V2_1$ may be a ground potential. The current source 231 provides an output current I231 that can flow through the electronic switch 232 and the input transistor of the first current mirror 233 when the electronic switch 232 is switched on. In the embodiment shown in FIG. 4A, the electronic switch 232 is a MOSFET, in particular an n-type MOSFET, that is controlled by the first control signal CS11. The electronic switch 232 is in the on-state when the control signal CS11 has an on-level and is in the off-state when the control signal CS11 has an off-level. The first current mirror 233 further includes an output transistor. This output transistor is connected in series with an input transistor of a second current mirror 234. The series circuit with the output transistor of the first current mirror 233 and the input transistor of the second current mirror 234 is connected between the second supply node $1_2$ and the fourth supply node $2_1$. In the embodiment shown in FIG. 4A, the first supply node $1_1$ and the second supply node $1_2$ are identical. An output transistor of the second current mirror 234 is connected in series with the resistor 211. The series circuit with the resistor 211 and the output transistor of the second current mirror 234 is connected between the first supply node $1_1$ (which is identical with the second supply node $1_2$ in this embodiment) and the output OUT.

In the controllable current source 212 shown in FIG. 4A, the current I212, which will be referred to as output current of the controllable current source in the following, is zero, when the first control signal CS11 has an off-level that switches off the electronic switch 232. In this case, the current through the input transistor of the first current mirror 233 is zero, consequently, the current through the output transistor of the first current mirror 233, the input transistor of the second current mirror 234, and the output transistor of the second current mirror 234 is zero. When the first control signal CS11 has an on-level, a current through the input transistor of the first current mirror 233 equals the current I231 provided by the current source 231. A current level of the output current I212 is proportional to the current level of the current I231, whereas a proportionality factor is defined by a current mirror ratio of the first current mirror 233 and a current mirror ratio of the second current mirror 234. For example, if the current mirror ratio of the first current mirror 233 is 1:m, and the current mirror ratio of the second current mirror 234 is 1:n, a level of the output current I212 is as follows:

$$I212_{ON}=m \cdot n \cdot I231_{ON} \quad (2),$$

wherein $I212_{ON}$ is the current level of the output current I212, when the first control signal CS11 has an on-level and the electronic switch 232 is switched on, and $I231_{ON}$ is the current level of the current I231 provided by the current source 231.

In the embodiment shown in FIG. 4A, the input transistor and the output transistor of the first current mirror 233 are implemented as MOSFETs, in particular as n-type MOSFETs. The input transistor and the output transistor of the second current mirror 234 are implemented as MOSFETs, in particular as p-type MOSFETs. The respective input transistor of each of the first and second current mirrors 233, 234 is diode-connected. That is, the gate node of the respective transistor is connected to its drain node. Implementing the transistors of the first and second current mirrors 233, 234 as MOSFETs is only an example. Other types of transistors, such as Bipolar Junction Transistors (BJTs) may be used instead.

Figure 4B:
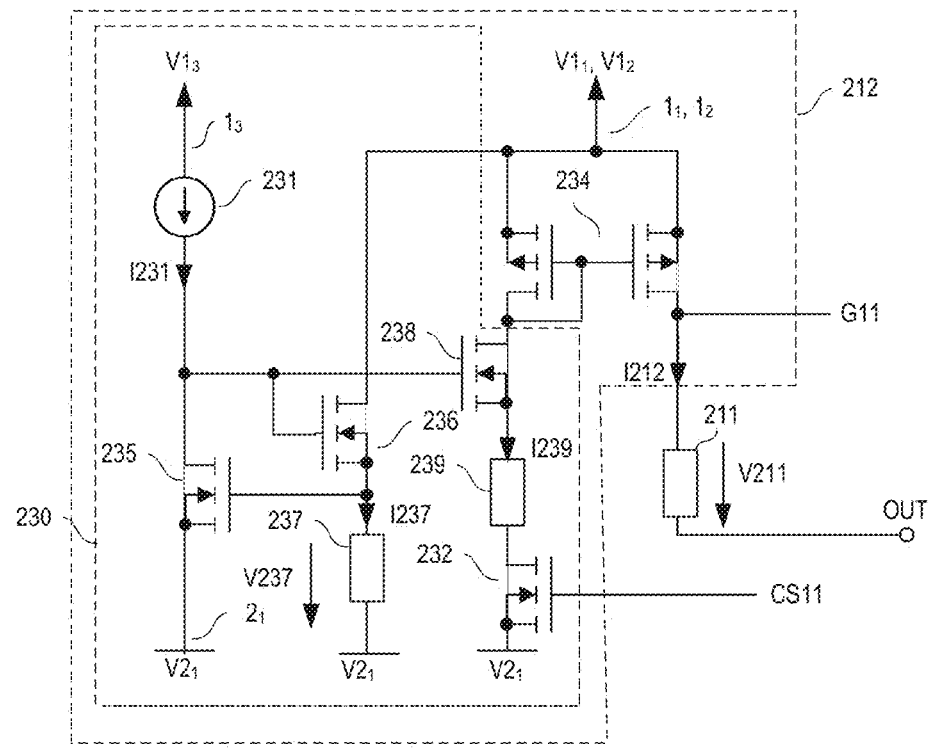

FIG. 4B shows another embodiment of the controllable current source 212. In this embodiment, the current source 231 is connected in series with a first transistor 235, which is controlled by a voltage V237 across a first resistor 237. This first resistor 237 is connected in series with a second transistor 236. The first transistor 235 and the second transistor 236 may each be implemented as a MOSFET. A series circuit with the first resistor and 237 and the second transistor 236 is connected between one of the first and second supply nodes $1_1$, $1_2$ and the fourth supply node $2_1$. A control node (gate node) of the second transistor 236 is connected to a circuit node common to the current source 231 and the first transistor 235. In order to be controlled by the voltage V237 across the first resistor 237 the control node (gate node) of the first transistor 235 is connected to a circuit node common to the first resistor 237 and the first transistor 236. In this circuit, the second transistor 236 drives a current through the first resistor 237 such that the voltage V237 across the first resistor 237 drives the first transistor 235 in an operation state in which the current I231 provided by current source 231 can flow through the first transistor 235. In other words, the second transistor 236 acts as a regulator that controls the gate-source voltage (which equals the voltage V237) of the first transistor 235 such that its drain-source current equals the current I231 provided by the current source 231.

In the circuit shown in FIG. 4B, a third transistor and a current mirror 234, which corresponds to the second current mirror 234 explained with reference to FIG. 4A, maps a current I237 through first resistor to the current I212 through the resistor 211 driving the output transistor 11 (not shown in FIG. 4B). The third transistor 238, which may be implemented as a MOSFET, is connected in series with the input transistor of the current mirror 234. A control node (gate node) of the third transistor is also connected to the circuit node common to the current source 231 and the first transistor 235 so that the second transistor 236 and the third transistor 238 have the same electrical potential at the control node (gate node). A second resistor 239 is connected in series with the third transistor 238. The electronic switch 232 is connected in series with the third transistor 238 and the second resistor 239.

According to one embodiment, the second transistor 236 and the third transistors 239 are transistors of the same type and have the same size, and the first resistor 237 and the second resistor 239 have substantially identical resistances, that is, R237=R239, whereas R237 is the resistance of the first resistor 237 and R239 is the resistance of the second resistor. In this case, and assuming that an on-resistance of the electronic switch 232 is negligible as compared to the resistance R239 of the second resistor 239, a current I239 through the third transistor 238 and the input transistor of the current mirror 234 equals the current through the first resistor 237 when the electronic switch 232 is switched on. The current I239 is zero when the electronic switch 232 is switched off. Consequently, the current I212 through the resistor 211 driving the output transistor 11 is proportional to the current I237 through the first resistor 237. According to one embodiment, resistances R237 and R211 of the resistors 237, 211 and a current mirror ratio of the current mirror 234 are adapted to one another such that the voltage V211 across the resistor 211 substantially equals the voltage V237 across the first resistor 237, that is, V211=V237. If 1:m is the current mirror ratio of the current mirror 234 (so that I212=m·I239) substantially equal voltages V211 and V237 can be obtained by selecting the resistance R211, R237 such that the resistance R237 of the first resistor 237 is m times the resistance of resistor R211 (R237=m·R211).

According to one embodiment, the first transistor 235 and the output transistor 11 are transistors of the same type. In this case, and if the voltages V237, V211 are substantially equal, the current IDS11 (see FIG. 1) through the output transistor 11, in the steady state, is substantially proportional to the current I231 provided by the current source 231. Current levels of these currents IDS11, I231 are substantially equal if the transistors 235, 11 have the same size, and the current level of the current IDS11 is a multiple of the current level of the current I231 if the size of the output transistor 11 is a multiple of the size of the first transistor 235. Thus, by the controllable current source 212 shown in FIG. 4B the current IDS11 through the output transistor 11 and, therefore, the output current can be adjusted.

Figure 5:
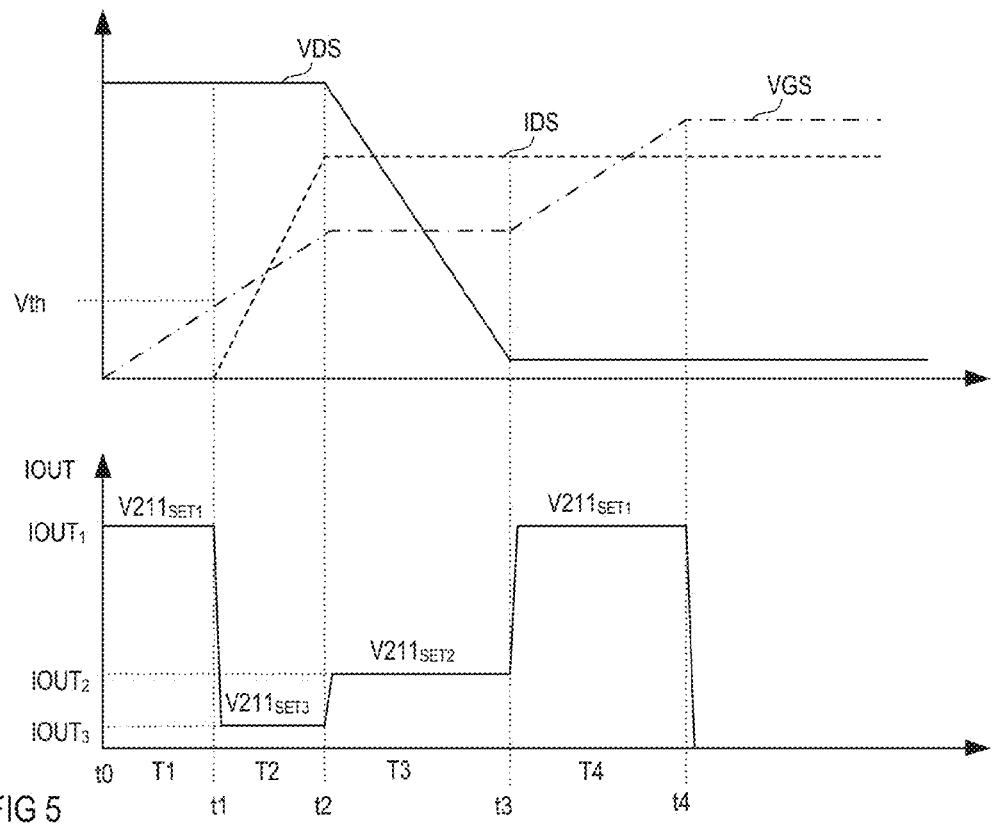
FIG. 5 shows one embodiment of varying an output current of the drive circuit based on load parameters.

According to one embodiment, the first driver 101 is configured to vary the output current IOUT, which equals the drain-source current IDS11 of the output transistor 11, based on at least one load parameter. This is explained with reference to FIG. 5, which shows timing diagrams of three different load parameters and the output current IOUT. For the purpose of explanation it is assumed that load Z is a MOSFET and that, referring to FIG. 1, load parameters of this MOSFET Z are a gate-source voltage VGS, a drain-source voltage and a drain-source current IDS. Timing diagrams of these load parameters are shown in FIG. 5. The timing diagrams shown in FIG. 5 schematically illustrate the process of switching on the MOSFET Z. The signal levels of VGS, VDS, and IDS that are shown in one timing diagram are not to scale. It is further assumed that the load path (drain-source path) of the MOSFET Z is connected in series with an electrical load (not shown), and that the series circuit with the MOSFET Z and the electrical load is connected to a voltage source (not shown). The electrical load may be one of an inductive load, a resistive load, and a capacitive load. For example, the timing diagrams shown in FIG. 5 apply to an inductive load.

The MOSFET Z is in an off-state when its gate-source voltage VGS is below a threshold voltage. The MOSFET can be driven in an on-state by the first driver 101 by charging the gate-source capacitance CGS with the output current. Driving the MOSFET Z in the on-state may include several stages that are explained with reference to FIG. 5 in the following. The timing diagrams shown in FIG. 5 begin at a time t0 at which the gate-source voltage VGS is zero so that the MOSFET Z is in the off-state. At this time the drain-source current IDS is zero, and the drain-source voltage VDS has a maximum defined by the voltage source (not shown) it is connected thereto. For the purpose of explanation it is assumed that the first driver 101 switches on at time t0 so that, beginning at t0, a current level of the output current IOUT is different from zero and charges the gate-source capacitance CGS of the MOSFET Z. Charging the gate-source capacitance CGS causes the gate-source voltage VGS to increase, whereas the drain-source current IDS is zero and drain-source voltage VDS has the maximum as long the gate-source voltage VGS is below the threshold voltage Vth.

In FIG. 5, t1 denotes a time when the voltage level of the gate-source voltage VGS reaches the threshold voltage. At this time, the drain-source current IDS starts to flow and a current level of the drain-source current IDS starts to increase. At first, the drain-source voltage VDS substantially keeps the maximum level when the drain-source current IDS increases. A voltage level of the drain-source voltage VDS starts to decrease when the gate-source voltage VGS has been charged to a voltage level at which the drain-source current IDS substantially reaches its maximum level, as defined by the voltage source and the load. This is shown beginning at time t2 in FIG. 5. Due to the Miller effect the voltage level of the gate-source voltage VGS is substantially constant as long as the drain-source voltage VDS decreases. At time t4, when the level of the drain-source voltage VDS reaches a minimum, the gate-source voltage VGS further increases until it reaches a maximum at time t4. The maximum of the gate-source voltage VGS is defined by the first driver 101.

Referring to the explanation above, driving the MOSFET Z into the on-state may include four phases as follows: a first phase T1, between t0 and t1, when the level of the gate-source voltage VGS increases but the drain-source current IDS is zero; a second phase T2, between t1 and t2, when the drain-source current IDS increases but the drain-source voltage VDS is still on a maximum level; a third phase T3, between t2 and t3 when the drain-source voltage VDS decreases; and a fourth phase, between t3 and t4, when the gate-source voltage VGS further increases. It may be desirable, to charge the gate-source capacitance CGS slower in the second and third phase T2, T3 than in the first and fourth phase in order to prevent EMI problems in those phases in which the drain-source current IDS and the drain-source voltage VDS change. This may be obtained by providing the output current IOUT with a first current level $IOUT_1$ in the first and fourth phase T1, T4, and with a second current level lower than the first level in the second and third phase T2, T3. In the embodiment shown in FIG. 5, the output current is provided with three levels, namely the first level $IOUT_1$ in the first and fourth phase T1, T4, a second level $IOUT_2$ lower than the first level $IOUT_1$ in the third phase T3, and a third level $IOUT_3$ lower than the second level $IOUT_2$ in the second phase T2. However, this is just an example, the process of driving the MOSFET into the on-state may be divided into more than four phases, and more than three different current levels may be chosen.

In the first driver 101 shown in FIG. 3, the output current IOUT (which equals the drain-source current IDS11 of the output transistor) may be varied by varying the gate-source voltage VGS11 of the output transistor. Basically, the output current IOUT increases as the gate-source voltage VGS11 of the output transistor 11 increases. The gate-source voltage VGS11 can be varied by varying the current I212 through the first resistor 211 by the controllable current source 212, whereas the gate-source voltage VGS11 of the output transistor 11 increases as the current level of the current I212 increases. In order to vary the output current I212 of the controllable current source 212 the control signal CS11 can be configured to not only include a switching information (on/off of the first driver 101), but also includes information on the desired current level of the current I212 based on the at least one load parameter explained with reference to FIG. 5. The control signal CS11 can be generated by a control circuit that receives a signal representing the at least one load parameter. This is explained in further detail below.

Figure 6:
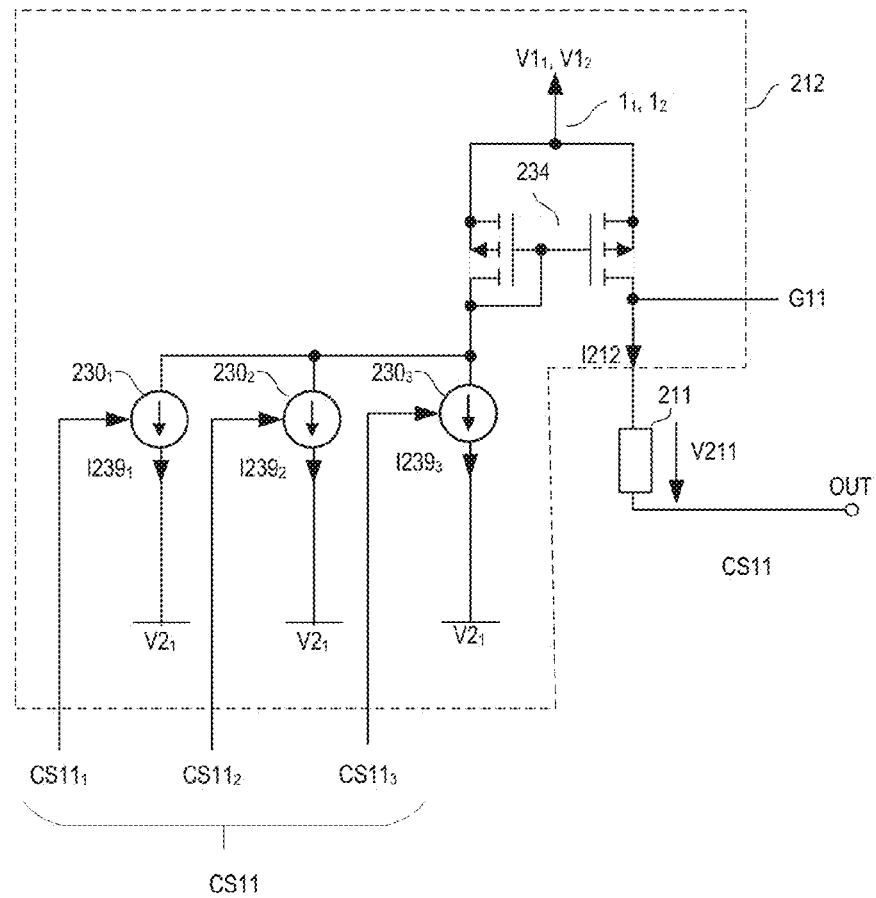
FIG. 6 shows one embodiment of a driver of the output transistor.

FIG. 6 shows one embodiment of a controllable current source 212 configured to generate different current levels of the output current I212. The controllable current source shown in FIG. 6 is based on the controllable current source shown in FIG. 4B and includes three current source circuits $230_1$, $230_2$, $230_3$ of the type labeled with 230 in FIG. 4B. The current source circuit 230 shown in FIG. 4B is that part of the controllable current source 212 that generates the current I239 flowing through the input transistor of the current mirror 234. In the controllable current source 212 shown in FIG. 6, each of the current source circuits $230_1$-$230_3$ is connected to the input transistor of the current mirror 234. The first control signal CS11 includes three sub-signals $CS11_1$, $CS11_2$, $CS11_3$. Each of these sub-signals controls one of the current source circuits $230_1$-$230_3$ such that it switches on or switches off the corresponding current source circuit $230_1$-$230_3$, whereas a current level of a current $I239_1$-$I239_3$ provided by the respective current source circuit is zero in the off-state and different from zero in the on-state. According to one embodiment, the individual current source circuits $230_1$-$230_3$ are implemented to provide different current levels of their output currents in the on-state $I239_1$-$I239_3$. In this case, the output current I212 varies dependent on which of the current source circuits $230_1$-$230_3$ is driven in the on-state (activated) by the first control signal CS11 having the sub-signals $CS11_1$, $CS11_2$, $CS11_3$. According to one embodiment, the first control signal CS11 is configured to operate only one of the current source circuits $230_1$-$230_3$ at one time. In this case, three different current levels of the output current I212 and, therefore, three different voltage levels of the voltage V211 can be generated. According to another embodiment, the first control signal CS11 is configured to operate one, two, or three of the current source circuits $230_1$-$230_3$ in the on-state at the same time. In this case 8 ($2^3$) different current levels of the current I212 can be generated (if the individual circuits $230_1$-$230_3$) provide different currents.

Figure 7:
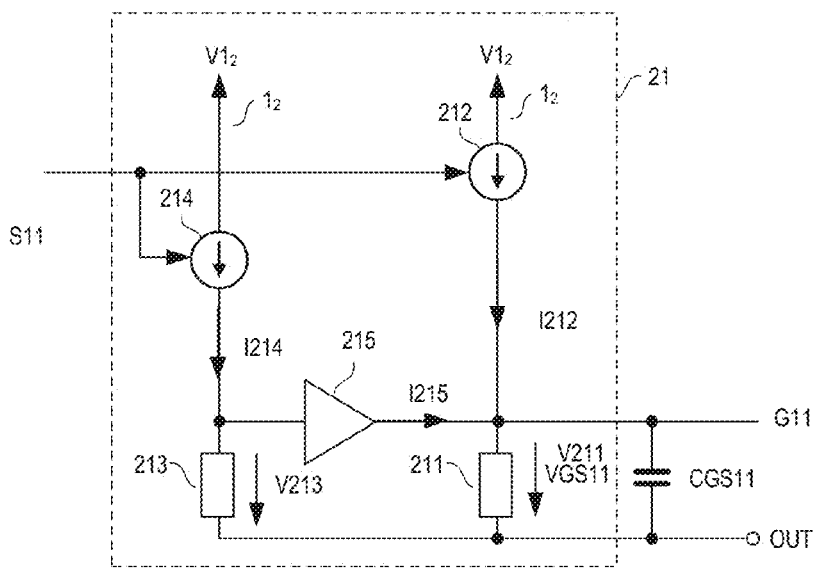
FIG. 7 shows another embodiment of the driver of the output transistor.

FIG. 7 shows another embodiment of the driver 21 configured to drive the output transistor 11. Besides the series circuit with the resistor 211 and the controllable current source 212, this driver 21 includes a further series circuit with a further resistor 213 and a further controllable current source 214 configured to provide a current I214. This further series circuit is connected between the second supply node $1_2$ (or the first supply node $1_1$) and the output OUT. The further current source 214 is controlled by the first control signal CS11, whereas a current level of a current I214 provided by this current source 214 is substantially zero when the control signal CS11 has an off-level and is different from zero when the control signal CS11 has the on-level. According to one embodiment, the controllable current source 212, the further controllable current source 214, the resistor 211 and the further resistor 213 are adapted to one another such that in the on-state of the driver 21 (i.e., when the first control signal CS11 has the on-level) and the steady state of the output transistor 11 a voltage V213 across the further resistor 213 is substantially equal a voltage V211 across the resistor 211, wherein voltage V211 equals the gate-source voltage VGS11 of the output transistor 11. The further controllable current source 214 may be implemented with the same current source topology as the controllable current sources 212 shown in FIGS. 4A-4B.

The resistor 211 and the gate-source capacitance CGS11 (which is shown in FIG. 7) of the output transistor 11 form an RC element. Due to this, in particular during transients from the on-state to the off-state of the output transistor 11, and vice versa, variations of the voltage level of the gate-source voltage VGS11 may occur. That is, during those transients, the gate-source voltage VGS11 may be different from $R211 \cdot I212_{ON}$ (see equation (1) above). In order to rapidly equalize those variations in the level of the gate-source voltage VGS11, the driver 21 includes an amplifier 215 coupled between a circuit node common to the further resistor 213 and the further controllable current source 214 and the gate node G11 of the output transistor 11. This amplifier 215, based on a relationship between the voltages V211, V213, is configured to either drive an output current I215 into the gate node G11 or draw a current from the gate node G11. That is, the amplifier 215 may provide a current I215 having a current flow direction as shown in FIG. 7, or a current flow direction opposite the current flow direction shown in FIG. 7. According to one embodiment, when the level of the gate-source voltage VGS11 falls below the level of the voltage V213 across the further resistor 213, the amplifier 215 drives a current into the gate node G11 in order to equalize the voltages V211, V213. If the voltage V211 rises above the voltage V213 then the amplifier 215 draws a current from the gate node G11 in order to equalize those voltages V211, V213.

Figure 8:
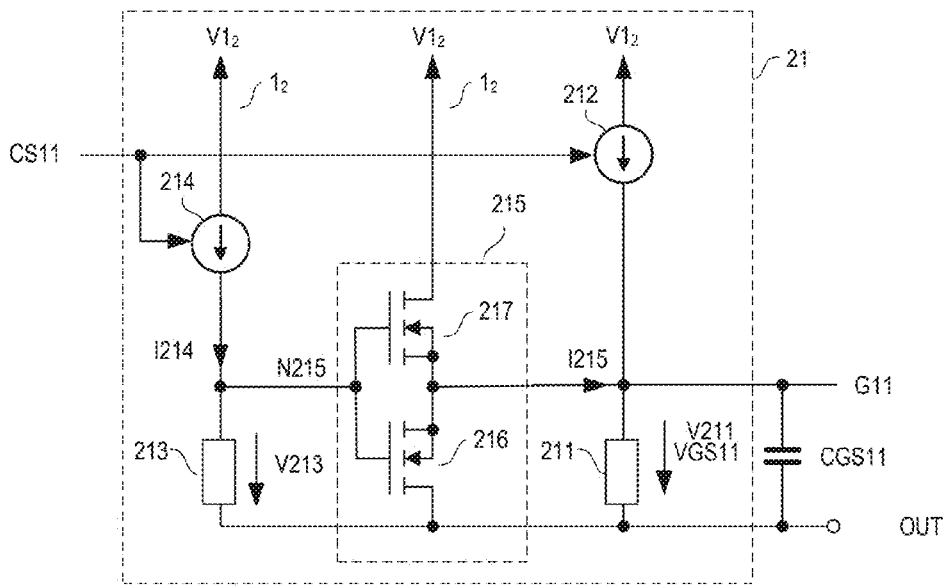
FIG. 8 shows one embodiment of an amplifier in the driver shown in FIG. 7.

According to one embodiment, shown in FIG. 8, the amplifier 215 includes a push-pull stage with a first transistor 216 and a second transistor 217 each having a control node and a load path. The load paths of these transistors 216, 217 are connected in series between the second supply node $1_2$ and the output OUT, and the control nodes of these transistors 216, 217 are connected to the circuit node common to the further resistor 213 and the further current source 214. An output of the amplifier 215 is formed by a circuit node common to the load paths of the transistors 216, 217. This output is connected to the gate node G11 of the output transistor 11. In the embodiment shown in FIG. 7, the first transistor 216 is implemented as a p-type MOSFET. This first transistor 216 has its load path connected between the gate node G11 and the output OUT. The second transistor 217 is implemented as an n-type MOSFET. The load path of this second transistor 217 is connected between the gate node G11 and the second supply node $1_2$. The output is formed by the source nodes of these two transistors 216, 217. In this driver 21, the push-pull stage drives an output current I215 into the gate node G11 whenever the gate-source voltage VGS11 falls below the voltage V213 minus the threshold voltage of the second transistor 217. On the other hand, the push-pull stage draws a current from the gate node G11 whenever the gate-source voltage VGS11 rises above the voltage V213 plus the threshold voltage of the first transistor 216.

Figure 9:
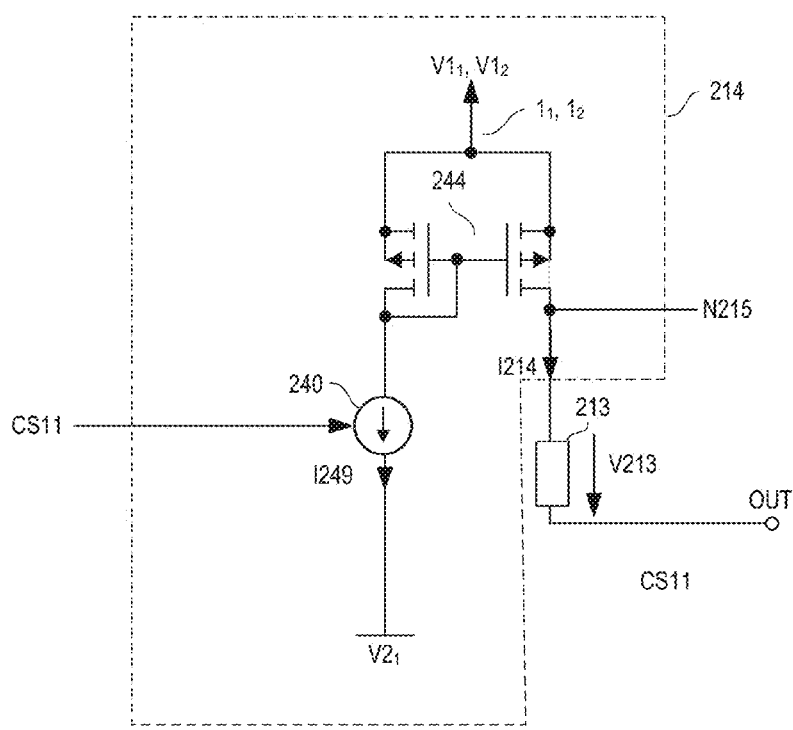
FIG. 9 shows one embodiment of a current source in the driver shown in FIG. 8.

FIG. 9 shows one embodiment of the controllable current source 214 in the driver 21 shown in FIG. 8. This current source includes a current mirror 244 with an input transistor and an output transistor, whereas the output transistor is connected to the second resistor 213. A current source circuit 240 controlled by the first control signal CS11 is connected to the input transistor of the current mirror. The current source circuit 240 can be implemented in accordance with the current source circuit 230 shown in FIG. 4B. A current level of the output current I214 provided by the further controllable current source 214 is proportional to a current level of a current I249 the current source circuit 240 generates in its on-state. The proportionality factor is defined by the current mirror ratio of the current mirror 244.

Due to the threshold voltages of the transistors 216, 217 in the push-pull stage there may be a voltage range of the voltage V211 in which the push-pull stage neither supplies a current to gate node G11 nor receives a current from the gate node. This voltage range is from V213+Vth217 to V213−Vth216, whereas Vth217 is threshold voltage of transistor 217 and Vth216 is the threshold voltage of transistor 216. In order for this range to be narrow, the transistors 216, 217 may be implemented with low threshold voltages, such as threshold voltages below 0.5V.

According to another embodiment, the current source 214 is configured to drive the current I214 with two different current levels such that the voltage V213 across the resistor 213 is either given by V211$_{SET}$+Vth217 or by V211$_{SET}$−Vth216, wherein V211$_{SET}$ is the desired voltage level of the voltage V211 across the first resistor 211 and is defined by the resistance R211 and the current provided by the controllable current source 212 in accordance with equation (1).

If the current I214 has a first current level such that V213 substantially equals V211$_{SET}$+Vth217 then the push-pull stage supplies a current to the gate node G11 if the voltage level of the voltage V211 falls below V211$_{SET}$. Equivalently, if the current I214 has a second current level such that V213 substantially equals V211$_{SET}$−Vth216 then the push-pull stage draws a current from the gate node G11 if the voltage level of the voltage V211 rises above V211$_{SET}$. In this way, the controllable current source 214 compensates the threshold voltages of the transistors 216, 217 in the push-pull stage. In the following, an operation mode in which the voltages V213 and V211 are adapted to one another such that the amplifier 215 sources a current to the gate node G11 if the voltage V211 falls below the set voltage V211$_{SET}$ will be referred to as current source mode of the amplifier. Equivalently, an operation mode in which the voltages V213 and V211 are adapted to one another such that the amplifier 215 sinks a current from the gate node G11 if the voltage V211 increases above the set voltage V211$_{SET}$ will be referred to as current sink mode of the amplifier.

Figure 10:
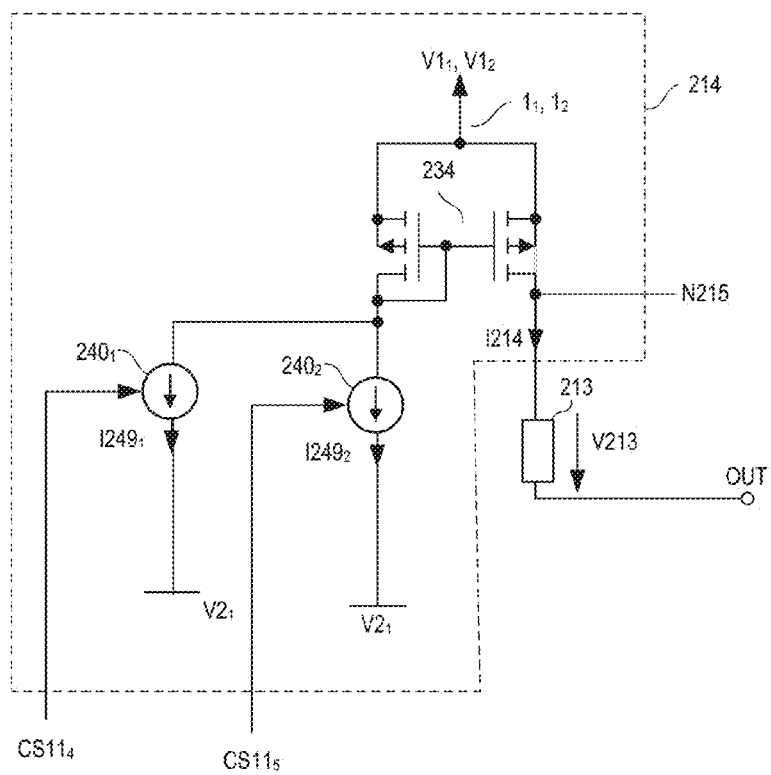
FIG. 10 shows another embodiment of the current source in the driver shown in FIG. 8.

FIG. 10 shows one embodiment of a controllable current source 214 that is configured to generate the voltage V213 at the second resistor 213 such that this voltage is either V211$_{SET}$+Vth217 in order to operate the amplifier 215 in the current source mode, or V211$_{SET}$−Vth216 in order to operate the amplifier 215 in the current sink mode. In this embodiment, the controllable current source 214 includes two current source circuits, namely a first current source circuit 240$_1$ configured, in the on-state, to provide an output current I249$_1$ with an output current level such that the output current I214 has a current level that causes the voltage V213 at the second resistor 213 to have the higher level V211$_{SET}$+V217th, and a second current source circuit 240$_2$ configured, in the on-state, to provide an output current I249$_2$ with an output current level such that the output current I214 has a current level that causes the voltage V213 at the second resistor 213 to have the lower level V211$_{SET}$−V216th. When the driver 21 is in the on-state one of these current source circuits 240$_1$, 240$_2$ is in the on-state at one time. The first control signal CS11 may include two sub-signals CS11$_4$, CS11$_5$ with each of these sub-signals controlling one of the current source circuits 240$_1$, 240$_2$.

Figure 11A:
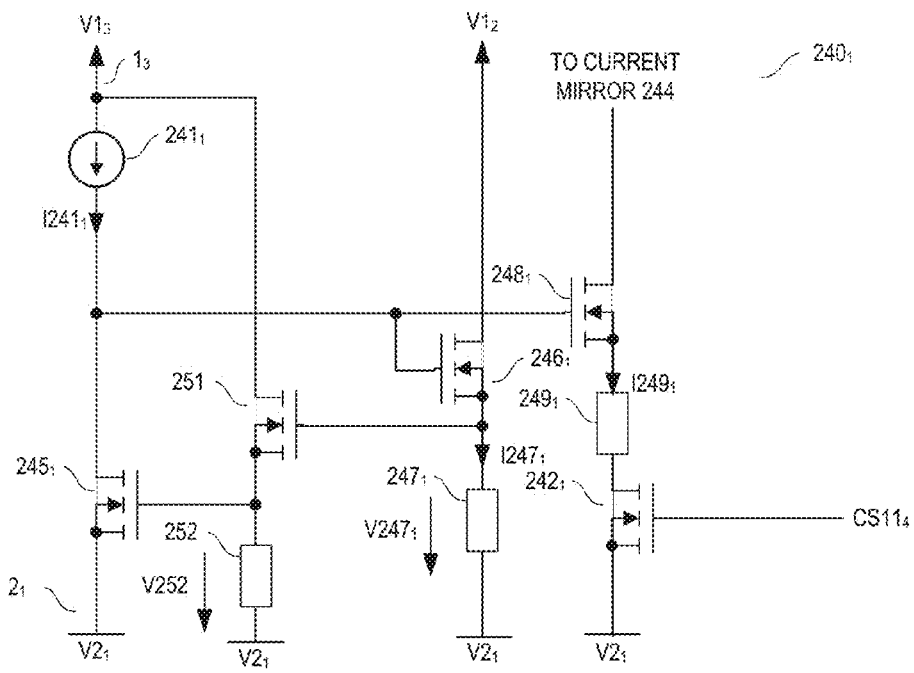
FIGS. 11A-11B show embodiment of current sources in the current source shown in FIG. 10.

FIG. 11A shows one embodiment of the first current source circuit 240$_1$ shown in FIG. 10. This current source circuit 240$_1$ is based on the current source circuit 230 shown in FIG. 4B. That is, it includes a series circuit with a current source 241$_1$ and a first transistor 245$_1$, a series circuit with a second transistor 246$_1$ and a first resistor 247$_1$, and a third transistor 248$_1$ connected in series with a second resistor 249$_1$ and an electronic switch 242$_1$ that is driven by sub-signal CS11$_4$. The current source circuit 240$_1$ shown on FIG. 11A is different from the current source circuit 230 shown in FIG. 4B in that it includes a series circuit with a fourth transistor 251 and a third resistor 252 connected between the third supply node $1_3$ and the fourth supply node $2_1$. In this circuit, the fourth transistor 251 is driven by a voltage across the first resistor 247$_1$, and the first transistor 245$_1$ is driven by a voltage V252 across the third resistor 252 connected in series with the fourth transistor 251.

According to one embodiment, resistances R247$_1$ and R213 of the resistors 247$_1$, 231 and a current mirror ratio of the current mirror 234 are adapted to one another such that the voltage V213 across the resistor 211 substantially equals the voltage V247$_1$ across the first resistor 247$_1$ that is, V213=V247$_1$. If 1:p is the current mirror ratio of the current mirror 244 (so that I213=m·I249$_1$) substantially equal voltages V211 and V247$_1$ can be obtained by selecting the resistance R213, R247$_1$ such that the resistance R247$_1$ of the first resistor 247$_1$ is p times the resistance of resistor R213 (R247$_1$=p·R213). In the current source circuit 240$_1$ the voltage V247$_1$ across the first resistor equals the sum of the gate source voltages of the first transistor 245$_1$ and the fourth transistor 251. According to one embodiment, the first transistor 245$_1$ is of the same type as the output transistor 11 and the fourth transistor 253 is of the same type as the transistor 217 in the push-pull stage and the current I241$_1$ substantially equals the current I231 in the controllable current source 212 shown in FIG. 4B. In this case, V213=V211$_{SET}$+Vth217, whereas V211$_{SET}$ is defined by the current source 212 as explained above. Thus, the amplifier 215 is in the current source mode if the first current source circuit 240$_1$ in the controllable current source 214 shown in FIG. 10 is implemented as shown in FIG. 11A and if the first current source circuit 240$_1$ is activated by the sub-signal CS11$_4$. The first transistor 245$_1$ and the output transistor 11 may have the same size. In this case, the current source 241$_1$ is designed such that the current level of the current I241$_1$ equals the drain-source current IDS11 of the output transistor 11 when the gate-source voltage VGS11 equals V211$_{SET}$. According to another embodiment, the size of the first transistor 245$_1$ is a fraction of the size of the output transistor 11. In this case, the current source 241$_1$ is designed such that the current level of the current I241$_1$ is a fraction of the drain-source current IDS11 of the output transistor 11 when the gate-source voltage VGS11 equals V211$_{SET}$. This helps to keep losses in the driver 21 low.

Figure 11B:
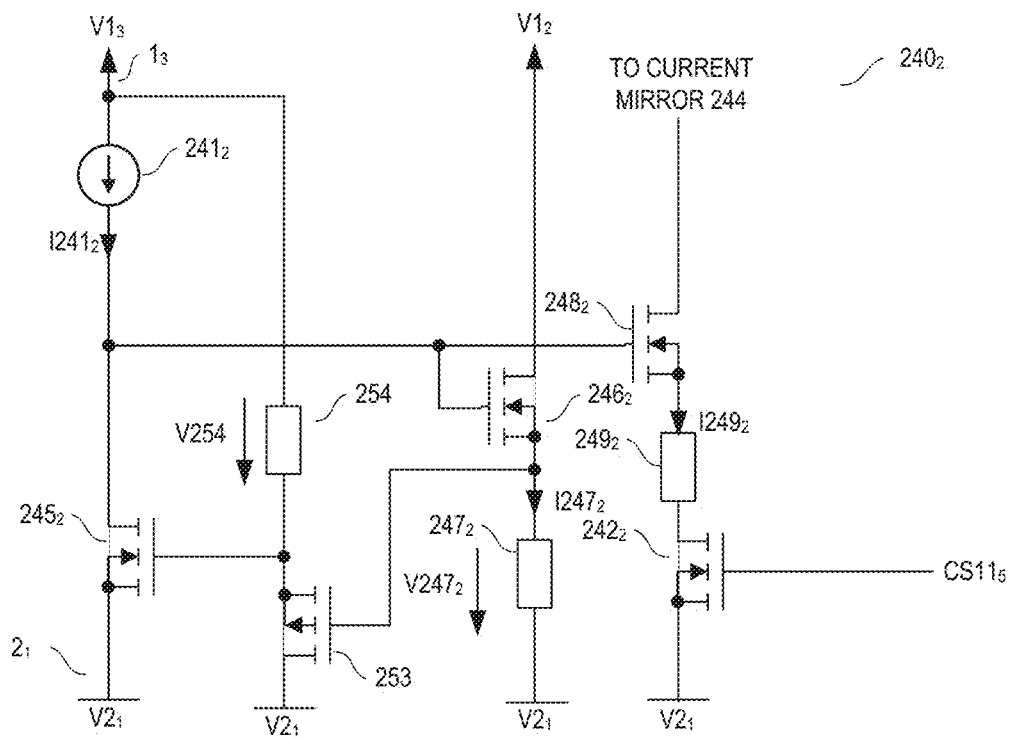

FIG. 11B shows one embodiment of the second current source circuit 240$_2$ shown in FIG. 10. This current source circuit 240$_2$ is based on the current source circuit 240$_1$ to which reference is made, whereas corresponding circuit elements have same reference characters that are only different by a subscript index "1" in FIG. 11A and a subscript index "2" in FIG. 11B. The current source circuit shown in FIG. 11B is different from the current source circuit shown in FIG. 11A in that a fourth transistor 253 connected in series with a third resistor 254 drives the first transistor 245$_2$ such that a voltage V247$_2$ across the first resistor 247$_2$ equals the gate source voltage of the first transistor 245$_2$ minus the gate source voltage of the fourth transistor 253. According to one embodiment, the fourth transistor 253 is of the same type as the transistor 216 in the push-pull stage, the first transistor 245$_2$ is of the same type as the output transistor 11 and has the same size, and the current I241$_2$ substantially equals the current I231 in the controllable current source 212 shown in FIG. 4B. In this case, V213=V211$_{SET}$-Vth216, whereas V211$_{SET}$ is defined by the current source 212 as explained above. Thus, the amplifier 215 is in the current sink mode if the second current source circuit 240$_2$ in the controllable current source 214 shown in FIG. 10 is implemented as shown in FIG. 11B and if the second current source circuit 240$_1$ is activated by the sub-signal CS11$_5$. The first transistor 245$_2$ and the output transistor 11 may have the same size. In this case, the current source 241$_2$ is designed such that the current level of the current I241$_2$ equals the drain-source current IDS11 of the output transistor 11 when the gate-source voltage VGS11 equals V211$_{SET}$. According to another embodiment, the size of the first transistor 245$_2$ is a fraction of the size of the output transistor 11. In this case, the current source 241$_2$ is designed such that the current level of the current I241$_1$ is a fraction of the drain-source current IDS11 of the output transistor 11 when the gate-source voltage VGS11 equals V211$_{SET}$. This helps to keep losses in the driver 21 low.

The further controllable current source 214 shown in FIG. 10 may be implemented in a driver 21 that includes a controllable current source 212 configured to generate only one current level of the current I212 (for example, as shown in FIG. 4B). In an embodiment in which the controllable current source 212 connected in series with the first resistor 211 is configured to generate different current levels of its output current I212 in order to generate different voltage levels of the gate-source voltage VGS11 (=V211) of the output transistor 11 and different current levels of the output current IOUT, respectively, the controllable current source 214 includes a pair of current source circuits 240$_1$, 240$_2$ of the type shown in FIGS. 10 and 11A, 11B associated with each of these current levels of the controllable current source 212. If, for example, the controllable current source 212 is implemented with three current source circuits 230$_1$-230$_3$ as shown in FIG. 6, which each are configured to define one of voltage levels V211$_{SET1}$, V211$_{SET2}$, V211$_{SET3}$ of the voltage V211 (the gate-source voltage VGS11), then the corresponding further controllable current source 214 includes a pair of (two) current source circuits associated with each current source circuit 230$_1$-230$_3$ in the current source 212, so as to be able to generate two different compensated voltages across the resistor 213 to each of the different voltage levels across the resistor 211. That is, the further controllable current source 214 includes six current source circuits of the type shown in FIG. 11A or 11B in order to vary the output current I214 between six different output current levels whereas each of these output current levels generates one of the following voltage levels of the voltage V213: V211$_{SETi}$+Vth217 and V211$_{SETi}$-Vth216 with being one of 1, 2 and 3. Thus, at each voltage level of voltage V211 (voltage level of the gate-source voltage VGS11) the amplifier 215 can be operated in one of the current source mode and the current sink mode. The first control signal CS11 controlling the first driver 101 includes nine sub-signals in this embodiment, namely three subs-signals to control the current level of the current I212 provided by the controllable current source 212, that is, to control the current source circuits 230$_1$-230$_3$ (see FIG. 6), and six control signals to control the current level of the current I214 provided by the further controllable current source 214.

According to one embodiment, in a driver of the type shown in FIG. 7, when implemented with a controllable current source 212 of the type shown in FIG. 7, each time one of the current source circuits 230$_1$-230$_3$ is switched on in order to generate one of the voltage levels V211$_{SET1}$-V211$_{SET3}$ across the first resistor 211 one of the current source circuits of the associated pair in the further controllable current source 214 is switched on. When the voltage level at the first resistor 211 changes by changing the current level of the current I212 the voltage level at 213 changes by changing the current level of the current I214. These changes are governed by the first control signal CS11. Referring to the above, the voltage level at the further resistor V213 can be such that the amplifier 215 operates in one of the current source mode and the current sink mode. According to one embodiment, the further controllable current source 214 is driven to generate the output current I214 such that amplifier 215 is in the current source mode (transistor 217 in the push pull stage is active) when the voltage level at the first resistor 211 increases, and in the current sink mode (transistor 216 in the push pull stage is active) when the voltage level at the first resistor decreases. This is explained below with reference to the example shown in FIG. 5.

Referring to the above, each of the output current levels $IOUT_1$–$IOUT_3$ is associated with one gate-source voltage level of the output transistor 11 and one voltage level of the voltage V211 at the first resistor 211, respectively, whereas each of the voltage levels at V211 is associated with one current level of the current I212. For the purpose of explanation it is assumed that $IOUT_1$ is associated with $V211_{SET1}$ and $I212_{SET1}$, $IOUT_2$ is associated with $V211_{SET2}$ and $I212_{SET2}$, and $IOUT_3$ is associated with $V211_{SET3}$ and $I212_{SET3}$, whereas $I212_{SET1}$–$I212_{SET3}$ are the current levels of I212 associated with $V211_{SET1}$–$V211_{SET3}$. The voltage levels $V211_{SET1}$–$V211_{SET3}$ associated with the output current levels $IOUT_1$–$IOUT_3$ are schematically illustrated in FIG. 5. For example, at time t1 the output current level of the controllable current source 212 decreases from $I212_{SET1}$ to $I212_{SET3}$ in order to reduce the gate source voltage level of the output transistor from $V211_{SET1}$ to $V211_{SET3}$. Reducing the gate source voltage level of the output transistor 11 involves discharging the gate-source capacitance CGS11. In order to provide for a fast transition between $V211_{SET1}$ and $V211_{SET3}$ the amplifier 215 is operated in the current sink mode. That is, the current level of the current I214 provided by the further controllable current source 214 is such that the voltage level of the voltage V213 across the resistor is $V211_{SET3}$–Vth216. Thus, in the push-pull stage the transistor 216 is active. At time t2 the output current level of the controllable current source 212 increases from $I212_{SET3}$ to $I212_{SET2}$ in order to increase the gate source voltage level of the output transistor from $V211_{SET3}$ to $V211_{SET2}$. Increasing the gate source voltage level of the output transistor 11 involves charging the gate-source capacitance CGS11. In order to provide for a fast transition between $V211_{SET3}$ and $V211_{SET2}$ the amplifier 215 is operated in the current source mode. That is, the current level of the current I214 provided by the further controllable current source 214 is such that the voltage level of the voltage V213 across the resistor is $V211_{SET2}$+Vth217. Thus, in the push-pull stage the transistor 217 is active. Equivalently, at time t3, when the gate-source voltage level is to increase from $V211_{SET2}$ to $V211_{SET1}$ the current level of the current I214 provided by the further controllable current source 214 is such that the voltage level of the voltage V213 across the resistor is $V211_{SET1}$+Vth217.

In the first drive circuit 101 explained above, the output transistor switches off when the first control signal CS11 deactivates (switches off) the current source 212 (in the embodiment shown in FIG. 3) or the current sources (in the embodiment shown in FIG. 5). In the driver 21 shown in FIG. 3, the gate-source capacitance CGS11 of the output transistor 11 discharges via the resistor 211 and the output transistor 11 switches off when the level of the gate-source voltage VGS11 falls below the threshold voltage of the output transistor 11. In the driver 21 shown in FIG. 6, the gate-source capacitance CGS11 of the output transistor 11 discharges via the resistor 211 and the first transistor 216 of the push-pull stage, whereas the output transistor 11 switches off when the level of the gate-source voltage VGS11 falls below the threshold voltage of the output transistor 11.

Figure 12:
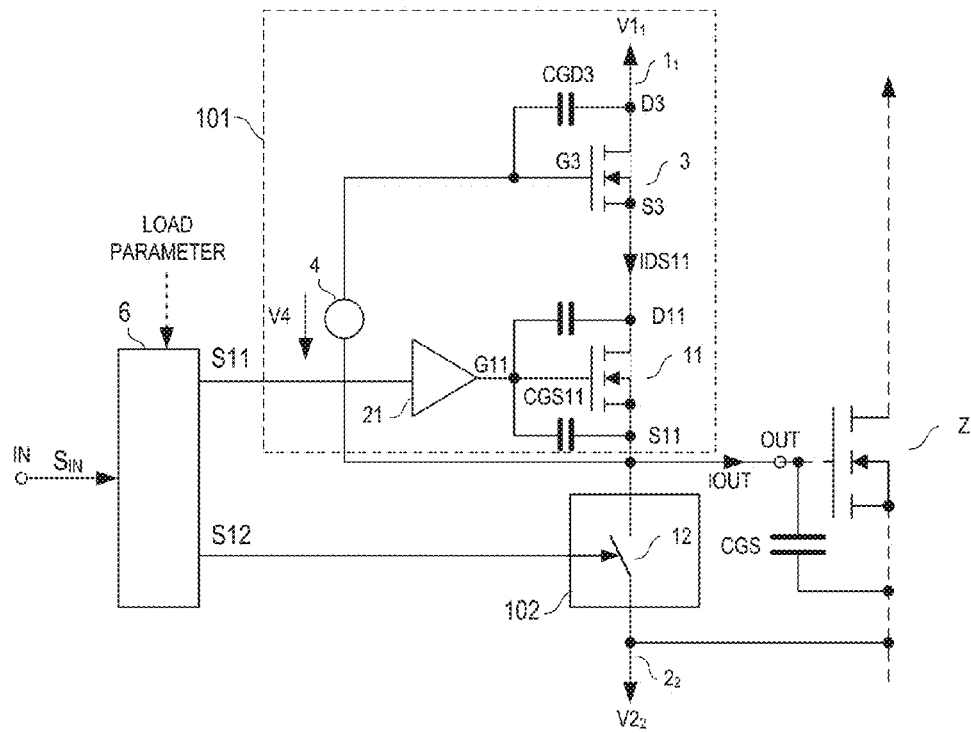
FIG. 12 shows timing diagrams illustrating one way of operation of the electronic drive circuit shown in FIG. 1.

FIG. 12 shows one embodiment of an electronic circuit that, besides the first drive circuit 101 (for charging the capacitive load) includes a second drive circuit 102 configured to discharge the capacitive load. This second drive circuit 102, which may also be referred to as low-side drive circuit, is connected between the output OUT and a fifth supply node $2_2$. If, as shown in FIG. 7, the capacitive load is the gate-source capacitance CGS of a MOSFET Z, the fifth supply node $2_2$ may correspond to the source node of the MOSFET. In this case, a supply potential $V2_2$ available at this supply node $2_2$ corresponds to the source potential of the MOSFET Z. The second drive circuit 102 is controlled by second control signal S12. In the embodiment shown in FIG. 12, the first control signal CS11 received by the first drive circuit 101 and the second control signal S12 received by the second drive circuit 102 are provided by a control circuit 6 based on an input signal $S_{IN}$ received at an input IN of the electronic circuit. The second drive circuit 102 includes an electronic switch 12 connected between the output OUT and the fifth supply mode $2_2$. This electronic switch 12 is driven by the second control signal S12. Like the first control signal CS11, the second control signal S12 may have one of an on-level and an off-level. According to one embodiment, the electronic switch 12 switches on when the second control signal S12 has the on-level, and switches off when the second control signal S12 has the off-level.

Besides the input signal $S_{IN}$ the control circuit 6 may receive at least one load parameter signal (illustrated in dashed lines), for example, in those cases where it is desirable to adjust different output voltage levels. In those cases, the first control signal CS11 may include several sub-signals as explained above. The control circuit 6 may include a digital controller such as, for example, a microcontroller.

Figure 13:
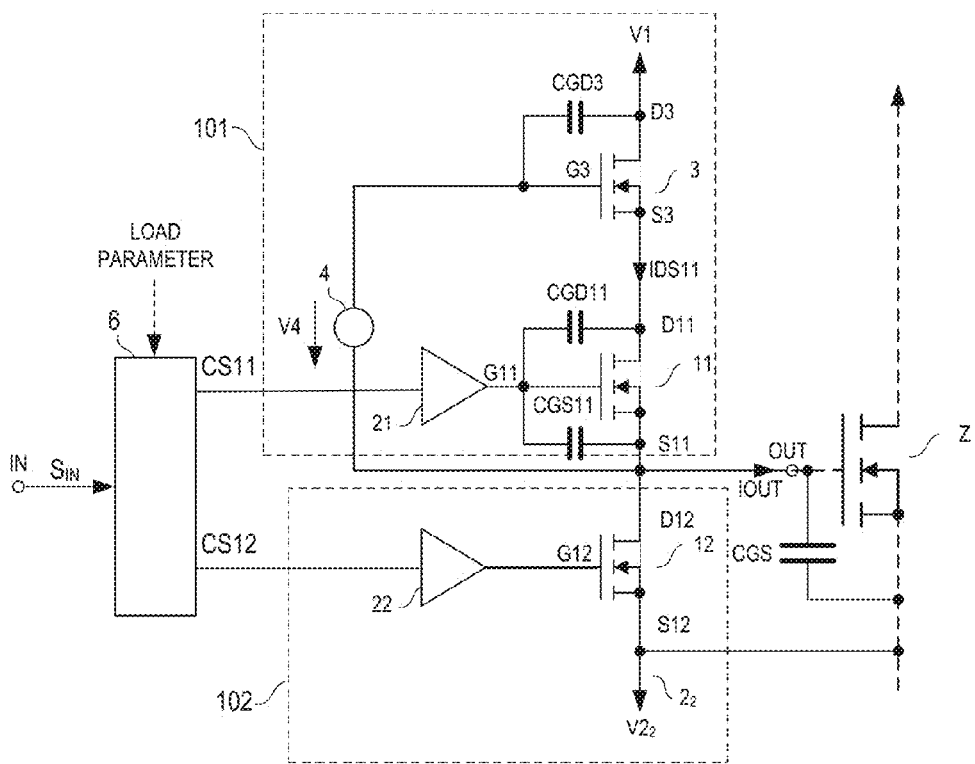
FIG. 13 shows an electronic drive circuit including a high-side drive circuit and a low-side drive circuit.

FIG. 13 shows one embodiment of the second drive circuit 102 in greater detail. In this embodiment, the second drive circuit 102 includes an electronic switch 12 implemented as a MOSFET, and a driver 22 configured to drive the MOSFET 12 based on the second control signal 12. The MOSFET 12 may be implemented as an n-type MOSFET having a drain node D12 connected to the output OUT, a source node S12 connected to the fifth supply node $2_2$, and a gate node G12 configured to receive a drive signal from the driver 22 based on the second control signal S12.

Figure 14:
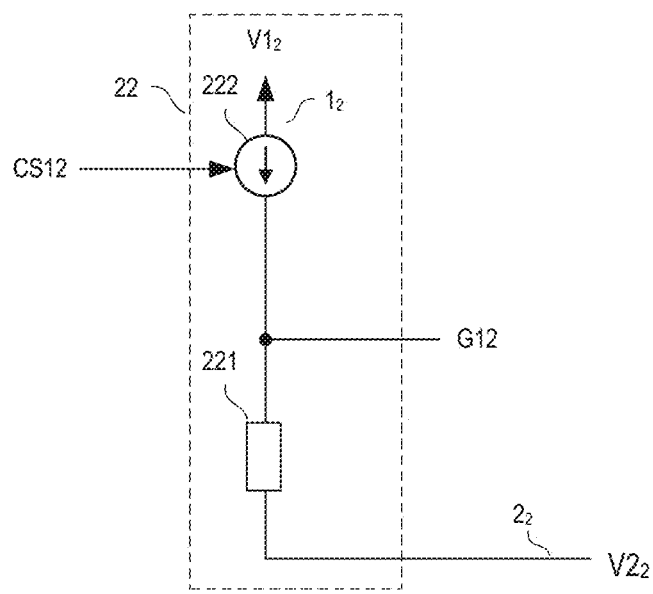
FIG. 14 shows one embodiment of the low-side drive circuit in greater detail.

The driver 22 in the second drive circuit 102 can be implemented in the same way as the driver 21 in the first drive circuit 101. FIG. 14 shows one embodiment of this driver 22. In this embodiment, the driver 22 is implemented with the same driver topology as driver 21 shown in FIG. 3. That is, driver 22 includes a series circuit with a resistor 221 and a controllable current source 222. The resistor 221 is connected between the gate node G11 of the transistor 12 (not shown in FIG. 14) and the fifth supply node $2_2$. The current source 222 is controlled by the second control signal S12 and is connected between the gate node G12 and one of the first and second supply nodes $1_1$, $1_2$. The controllable current source 222 may be implemented with the same current source topology as the current source 212 shown in FIG. 4.

Figure 15:
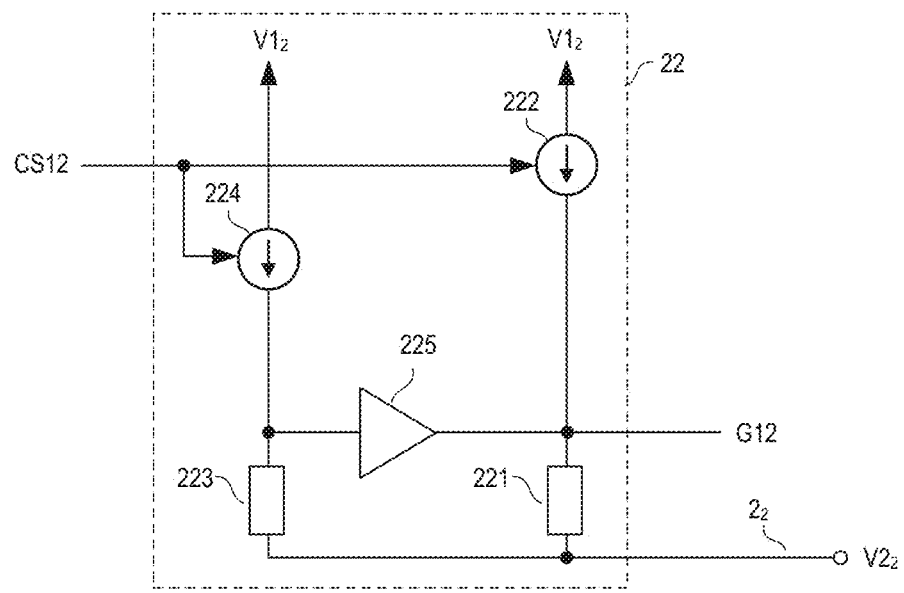
FIG. 15 shows one embodiment of a driver in the low-side drive circuit shown in FIG. 9.

According to yet another embodiment, shown in FIG. 15, the driver 22 configured to drive the transistor 12 in the second drive circuit 102 is implemented with a driver topology as explained with reference to FIG. 5. In this case, the driver 22 includes a further series circuit with a further resistor 223 and a further controllable current source 224 connected between one of the first and second supply nodes $1_1$, $1_2$ and the fifth supply node $2_2$. Furthermore, a push-pull stage 225 is connected between a circuit node common to the resistor 223 and the further current source 224 and the gate node G12 of the transistor 12 (not shown in FIG. 15).

When the low-side driver 102 is active the output current IOUT flows in a direction opposite the direction shown in FIGS. 12 and 13. Like the high-side driver 101 the low-side driver 102 may be implemented to generate different output current levels by generating different gate source voltage levels of transistor 12.

Figure 16:
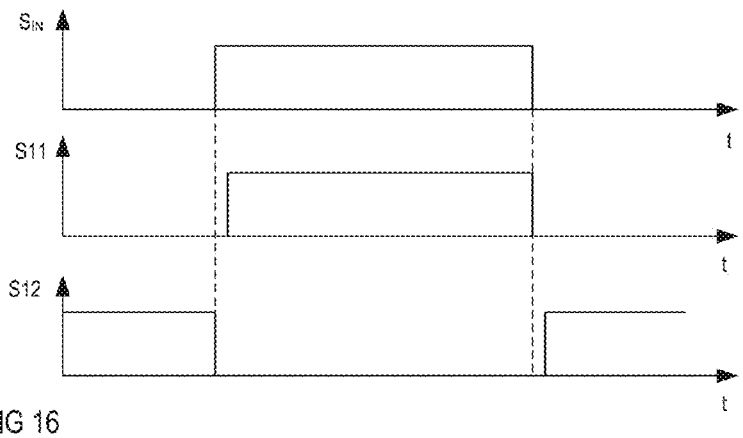
FIG. 16 shows another embodiment of a driver in the low-side drive circuit shown in FIG. 9.

One way of operation of the control circuit 6 shown in FIGS. 12 and 13 is explained with reference to FIG. 16 below. FIG. 16 shows timing diagrams of the input signal $S_{IN}$ of the electronic circuit and of the first and second control signal CS11, S12. For the purpose of explanation it is assumed that the input signal $S_{IN}$ can have one of two different signal levels, namely a first signal level and a second signal level. For the purpose of explanation, it is assumed, that the first signal level is high-level and the second signal level is a low-level in the embodiment shown in FIG. 16. In this embodiment, the first signal level indicates that it is desired to charge the capacitive load (to switch on the MOSFET Z). In FIG. 16, only one first control signal CS11 is shown although the first control signal CS11 may include several sub-signals. The same applies to the second control signal CS12. In FIG. 16, an on-level (high-level) of the first control signal CS11 just indicates that the high-side driver 101 is activated (output transistor 11 is on), disregarding of whether or not different gate-source voltage levels of the output transistor 11 can be adjusted. Equivalently, in FIG. 16, an on-level (high-level) of the second control signal CS12 just indicates that the low-side driver 102 is activated (transistor 12 is on), disregarding of whether or not different gate-source voltage levels of the output transistor 12 can be adjusted. The control circuit 6 may be configured to activate the high-sider driver 101 when the input signal $S_{IN}$ reaches the first signal level (high-level). When the high-side driver 102 is active, the low-side driver 102 is inactive (represented by a low-level of the control signal CS12 in FIG. 16) in order to prevent a current shoot through. Equivalently, the second signal level (low-level) of the input signal $S_{IN}$ indicates that it is desired to discharge the capacitive load. Thus, the control circuit 6 is configured to activate the low-side driver 102 when the input signal $S_{IN}$ has the low-level. During those time periods in which the low-side driver 102 is active, the high-side driver is inactive in order to prevent current shoot through. In order to safely prevent a current shoot through, there may be delay times between those times when the low-side driver 102 is deactivated (represented by the off-level of the second control signal S12) and those times when the high-side drive circuit 101 is activated (represented by the on-level of the first control signal CS11). Those delay times (dead times) are schematically illustrated in FIG. 16. Equivalently, there may be delay times between those times when the high-side drive circuit 101 is deactivated (represented by the off-level of the first control signal CS11) and those times when the low-side drive circuit 102 is activated (represented by the on-level of the second control signal S12).

Figure 17:
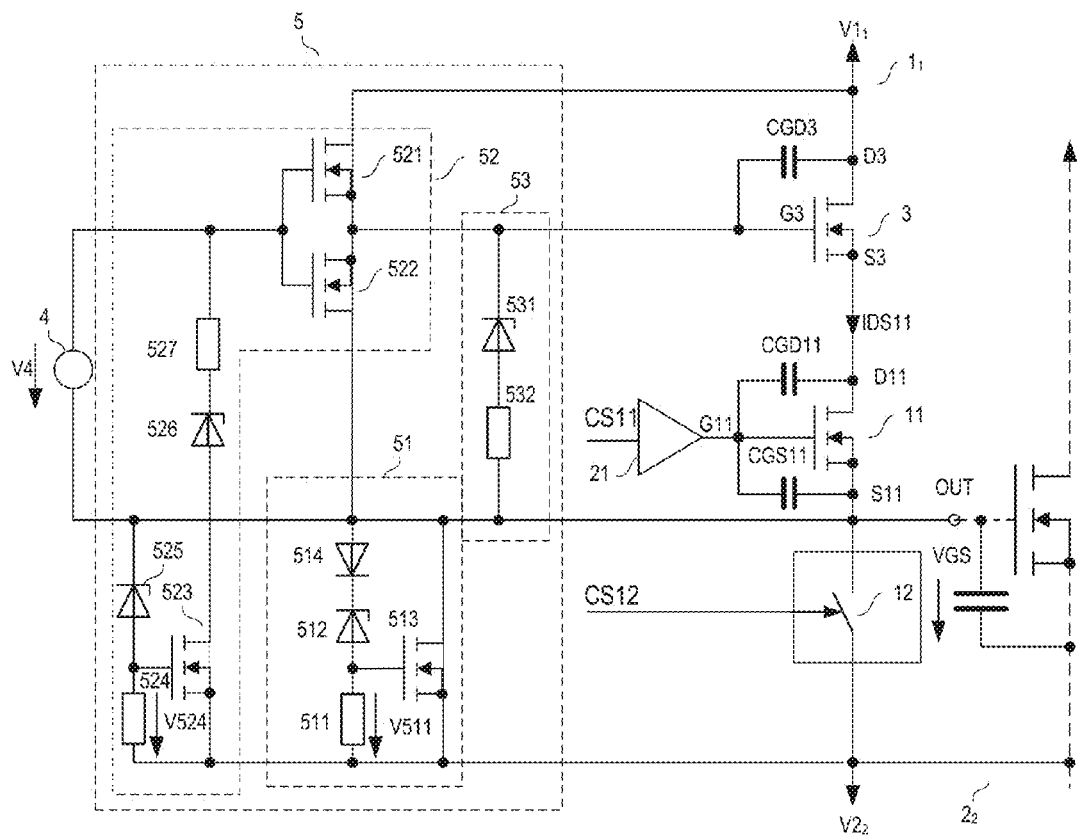
FIG. 17 shows an electronic drive circuit including a clamping circuit according to one embodiment.

FIG. 17 shows a modification of the electronic circuit explained herein before. In the embodiment shown in FIG. 17, the electronic circuit includes a clamping circuit 5 with three clamping stages 51, 52, 53. A first clamping stage 51 is configured to limit the voltage between the output OUT and the fifth supply node $2_2$ and across the capacitive load CGS, respectively. This voltage will be referred to as output voltage of the electronic circuit in the following. Referring to FIG. 17, the first clamping stage may include a series circuit with a resistor 512 and voltage limiting element 512 connected between the output OUT and the fifth supply node $2_2$. The voltage limiting element 512 may include at least one Zener diode 512. That is, the voltage limiting element 512 may include one Zener diode (as shown) or several Zener diodes connected in series. The first clamping stage further includes a transistor 513 that is driven by a voltage V511 across the resistor 511 and that has a load path connected between the output OUT and the fifth supply node $2_2$. For example, the transistor is an n-type MOSFET. One way of operation of the first clamping stage 51 is as follows. When the output voltage increases such that it reaches a first voltage limit (for example, the Zener voltage if the voltage limiting element includes a Zener diode) defined by the voltage limiting element 512 a current flows through the voltage limiting element 512 and the resistor 511 so that the transistor 513 switches on in order to substantially keep the level of the output voltage at the first voltage limit.

In the first clamping stage 51, a bipolar diode connected in series with voltage limiting element and the resistor 511 is optional and may be used to define the voltage limit. This diode 514 increases the voltage limit so that the voltage limit is given by the voltage limit defined by the voltage limiting element 512 plus the forward voltage of the diode 514.

The second clamping stage 52 deactivates the voltage regulator when the output voltage reaches a second voltage limit. According to one embodiment, the second voltage limit is lower than the first voltage limit. The second clamping stage 52 includes a push-pull stage 521, 522 that receives the biasing voltage V4 at an input and has an output connected to the gate node G3 of the voltage regulator transistor 3. The push pull stage may be implemented with an n-type transistor 521 and a p-type transistor that have their load paths connected in series between the first supply node $1_1$ and the output OUT. The control nodes of these transistors 521, 522 form the input of the push-pull stage and a circuit node common to the load paths forms the output of the push-pull stage. In the embodiment shown in FIG. 17 the transistors 521, 522 are MOSFETs the source nodes of which form the output of the push-pull stage. The second clamping stage 52 further includes a series circuit with a resistor 524 and a voltage limiting element 525 connected between the output OUT and the fifth supply node $2_2$. The voltage limiting element 525 may include at least one Zener diode 525. That is, the voltage limiting element 525 may include one Zener diode (as shown) or several Zener diodes connected in series. The second clamping stage 52 further includes a transistor 523 that is driven by a voltage V524 across the resistor 524 and that has a load path connected between the fifth supply node $2_2$ and the input of the push-pull stage 521, 522. According to one embodiment, a further voltage limiting element (e.g., a Zener diode) 526 and a further resistor 527 are connected in series with the transistor 523 between the fifth supply node $2_2$ and the input of the push-pull stage 521, 522. For example, the transistor 523 is an n-type MOSFET.

One way of operation of the second clamping stage 52 is as follows. When the output voltage increases such that it reaches a first voltage limit (for example, the Zener voltage if the voltage limiting element includes a Zener diode) defined by the voltage limiting element 525 a current flows through the voltage limiting element 525 and the resistor 524 so that the transistor 523 switches on. When the transistor 523 switches on it pulls down the electrical potential at the input of the push-pull stage and, therefore, the electrical potential at the gate node G3 of the regulator transistor 3. This switches off the regulator transistor 3 and, therefore, deactivates the voltage regulator. The voltage source 4 may be implemented with a high internal resistance so that losses are low when the transistor 523 switches on.

According to one embodiment, the voltage limit defined by the first clamping stage 51 is higher than the voltage limit defined by the second clamping stage 52. In this way, when the output voltage VGS increases, the regulator is deactivated by the second clamping stage before the first clamping stage clamps the output voltage.

According to one embodiment, the clamping circuit includes a third clamping stage 53 connected between the gate node G3 of the regulator transistor 3 and the output node. Thus, the third clamping stage 53 substantially clamps the load path voltage (drain-source voltage) of the output transistor 11. The third clamping stage may include a resistor 532 and a voltage limiting element 531 connected in series with the resistor 532. The voltage limiting element may include at least one Zener diode. That is, the voltage limiting element 531 may include one Zener diode (as shown) or several Zener diodes connected in series.

The invention claimed is:

1. A drive circuit, comprising:
   an output;
   a first output transistor comprising a control node and a load path, wherein the load path is coupled between the output and a first supply node;
   a voltage regulator configured to control a voltage across the load path of the first output transistor; and
   a first driver configured to drive the first output transistor based on a first control signal, wherein the first driver comprises a first resistor connected between the control node and the output and a first current source configured to drive a first current through the first resistor based on the first control signal.

2. The drive circuit of claim 1, wherein the voltage regulator comprises:
   a regulator transistor comprising a control node and load path, wherein the load path of the regulator transistor is connected in series with the load path of the first output transistor, and wherein a series circuit with the load path of the regulator transistor and the load path of the first output transistor is connected between the output and the first supply node.

3. The drive circuit of claim 2, wherein the load path node of the first output transistor is connected to the output.

4. The drive circuit of claim 2, wherein the first output transistor and the regulator transistor are transistors of the same conductivity type.

5. The drive circuit of claim 4, wherein each of the first output transistor and the regulator transistor is a MOSFET.

6. The drive circuit of claim 1, wherein the first driver further comprises:
   a second resistor and a second current source configured to drive a current through the second resistor; and
   a first amplifier connected between a circuit node common to the second resistor and the second current source and the control node of the first output transistor.

7. The drive circuit of claim 6, wherein the first amplifier comprises a push-pull stage configured to operate in one of a current source mode and a current sink mode based on a current provided by the second current source.

8. The drive circuit of claim 7,
   wherein the first current source, controlled by a control circuit, is configured to generate different current levels of the first current through the first resistor, and
   wherein the second current source, controlled by the control circuit, is configured to operate the amplifier in the current source mode when the current level of the first current through the first resistor increases, and in the current sink mode when the current level of the first current through the first resistor decreases.

9. A method, comprising:
   driving a first output transistor coupled to an output of a drive circuit by a first driver based on a first control signal by driving a first current through a first resistor based on the first control signal by a first current source, wherein the first resistor is connected between a control node of the first output transistor and the output; and
   controlling a voltage across the load path of the first output transistor by a voltage regulator.

10. The method of claim 9, wherein the voltage regulator comprises:
    a regulator transistor comprising a control node and load path, wherein the load path is connected in series with the load path of the first output transistor, and wherein a series circuit with the load path of regulator transistor and the load path of the first output transistor is connected between the output and the first supply node.

11. The method of claim 10, wherein driving the first output transistor further comprises:
    driving a second current through a second resistor by a second current source; and
    operating a first amplifier connected between a circuit node common to the second resistor and the second current source and the control node of the first output transistor in one of a current source mode and a current sink mode based on a current provided by the second current source.

12. The method of claim 10, the method further comprising:
    generating different current levels of the first current by the first current source, controlled by a control circuit; and
    by the second current source controlled by the control circuit, operating the amplifier in the current source mode when the current level of the first current through the first resistor increases, and in the current sink mode when the current level of the first current through the first resistor decreases.

13. The method of claim 9, the method further comprising:
    deactivating the voltage regulator based on a voltage between the output and a supply node.

14. The method of claim 9, the method further comprising:
    driving an MOS transistor by the first output transistor.

* * * * *